United States Patent [19]

Crawford et al.

[11] Patent Number: 5,000,286

[45] Date of Patent: Mar. 19, 1991

[54] MODULAR LOUDSPEAKER SYSTEM

[75] Inventors: Tracy E. Crawford, Foster City, Calif.; Rogelio Delgado, Jr., Rosston; Michael T. Oliver, Mineral Springs, both of Ark.

[73] Assignee: Klipsch and Associates, Inc., Hope, Ark.

[21] Appl. No.: 394,135

[22] Filed: Aug. 15, 1989

[51] Int. Cl.[5] .............................................. H05K 5/00

[52] U.S. Cl. .................................. 181/145; 181/147; 181/150; 181/152; 181/154; 181/199

[58] Field of Search ............... 181/145, 147, 150, 152, 181/159, 199, 154; 312/111, 198–202

[56] References Cited

U.S. PATENT DOCUMENTS 4,014,597 3/1977 Griffin, Jr. ...................... 181/199 X
4,805,730 2/1989 O'Neill et al. .................. 181/145 X

*Primary Examiner*—Benjamin R. Fuller

*Attorney, Agent, or Firm*—Woodard, Emhardt, Naughton Moriarty & McNett

[57] ABSTRACT

A modular loudspeaker system of uniformly sized and shaped loudspeaker modules permits hanging of a plurality of the modules in a wide variety of desired configurations. Each module has a pair of side walls with recessed upper and lower marginal edge portions and an integrally formed reinforced connectable structure that spans between the recessed edge portions for reinforcement of the module across its side. When several modules are hung vertically, the vertically aligned reinforced connectable structures reinforce the system along its entire length. Three module types are disclosed, with one type adapted for removable mounting therein of a speaker horn via a quick release hub. Overall, the system provides optimum versatility in adapting to the acoustical requirements of a wide variety of performance venues.

6 Claims, 5 Drawing Sheets

MODULAR LOUDSPEAKER SYSTEM

FIELD OF THE INVENTION

This invention relates to a loudspeaker module and more particularly to a versatile modular loudspeaker system comprised of a selected number of the modules.

BACKGROUND OF THE INVENTION

A sound reproduction company faces several major concerns in moving a sound system from one venue to the next. From an acoustic standpoint, a movable sound system must produce a desired output level while maintaining high fidelity. The system must also be directionally flexible so that polar sound wave patterns can be varied to suit the acoustical shape of each particular performance location.

From a practical standpoint, other factors that must be considered include the truck space required to pack the system, the number of men required to set up and tear down the system, the weight of the speakers themselves, and the complexity of both connecting the electrical cables to the speakers and suspending or flying the system from the ceiling of an auditorium in a particular orientation. Safety must also be considered in flying a system. Ultimately, the success of a movable sound system depends to a large extent upon its ability to adequately address each of these concerns in a cost effective manner.

Some prior sound systems have utilized a modular approach to address some of these concerns. For instance, O'Neill et al. U.S. Pat. No. 4,805,730 discloses a loudspeaker enclosure having trapezoidal shaped end (top and bottom) walls, a back wall and two side walls extending between the end walls. Each of the side walls has outwardly projecting ribs that extend on a line between a front wall and the rear wall. One side wall has an odd number of ribs while the other side wall has an even number of ribs. Placing of two of these enclosures side by side intermeshes the outwardly projecting ribs. By inserting a pivot pin through aligned holes in the intermeshed ribs, the enclosure can be secured together at a fixed angular relationship that is determined by the shapes of the end wall trapezoids. While the ribs facilitate side by side connection of these enclosures, the overall versatility of this system is rather limited due to the fact that the angular relationship between adjacent speakers is predetermined and fixed by the shapes of the end walls. Moreover, the side wall ribs do not provide any benefit in vertical stacking of the enclosures.

LeTourneau U.S. Pat. No. 4,179,008 also shows a modular approach. A group of cylindrically shaped speaker housings with interspaced angled wedge blocks are held taut in a generally toroidal shape by a flexible tension member. The tension member is releasable so that the speaker housings can be rotated into a selective orientation. Subsequently, the tension member is tightened to retain the speakers in the selected orientation. This system provides some directional versatility in that each of the speaker housings may be rotated. However, the versatility of the system is also rather limited because a predetermined number of housings and wedges are required to complete the toroidal shape. Again, as with O'Neill, the system does not provide any advantage in vertically stacking the housing. Moreover, the wedges also represent an additional shipping cost.

Griffin U.S. Pat. No. 4,014,597 discloses two main speaker enclosures that can be latched together to form a box to facilitate transporting of the speakers. The internal configurations of the enclosures are dimensioned to receive and hold two auxiliary speakers. The enclosures have handles mounted to their external surfaces to further facilitate transport. While this speaker enclosure may facilitate transport, the rearwardly converging side walls make it difficult to hang two of these enclosures in side-by-side relationship.

In view of the shortcomings in these and other prior art sound systems, there exists a need to develop a sound system that can be quickly and easily adapted to accommodate the acoustic parameters of a wide variety of performance venues, and which can be packed, shipped, electrically connected and hung in a cost effective manner.

SUMMARY OF THE INVENTION

The invention is directed to a modular loudspeaker system comprising at least two uniquely shaped loudspeaker modules. The modules have a pair of opposing side walls, with a reinforced connectable means as an integral part of each side wall. The reinforced connectable means provides structural integrity across the entire side, i.e., from top to bottom, of the module, and also reinforces the modules substantially along the entire length of the system of modules when two or more of the modules are hung or stacked in vertical alignment.

The invention provides a sound system having optimum acoustic directability and structural integrity. The sound system is simple to assemble, electrically connect and hang. It also can be easily transported within a minimum space requirement.

In another of its features, the system includes three electrically distinctive types of modules, all with the same size and shape, but with different internal sound reproduction capabilities. One of the module types is adapted for removable mounting of a horn speaker therein in at least two different orientations, thereby allowing a sound technician to orient a midrange/tweeter horn either vertically or horizontally.

In accordance with a preferred embodiment of the invention, a modular loudspeaker system includes a plurality of similarly sized and shaped loudspeaker modules. Each of these modules has a rear wall, trapezoidal shaped top and bottom walls that converge toward the rear wall and side walls which, together with the top and bottom walls, define an enclosure and a forward opening spaced from the rear wall. Each of the side walls includes an outwardly directed major planar surface and upper and lower marginal edge portions recessed from the planar surface. Each of the side walls also has an integrally formed reinforced connectable means which spans between the upper and lower recessed marginal edge portions, thereby reinforcing the module across its side. Each reinforced connectable means includes an internal spaced pair of aluminum plates secured to the side wall opposite from the recessed marginal edges, an internal pair of spaced braces interconnecting the plates, and connectors securing the plates to the side wall and extending through the respective side walls into the recess and terminating short of the major planar surface.

To fly or hang several of the modules in a modular loudspeaker system, straps are interconnected to a suspended overhead member such as a fly bar and to the protruding connectors located within the upper marginal edge portion of the topmost module. Modules located below the topmost enclosure may be connected by additional side straps extending between the connectors situated in the adjacent upper and lower marginal edge portions, or by a rigid spacer. A tilt or splay strap connects the rear walls of the modules to the fly bar and enables a central axis of the aligned modules to be varied from the vertical. Moreover, repositioning of the side straps enables variation in the angle of disposition between adjacently connected modules. The interconnections between the connected modules all reside substantially within a common plane, a plane that is occupied by the reinforced connectable means and located inboard of the vertically aligned side wall planar surfaces of the modules. This prevents entanglement of the straps and the electrical cables.

The structural integrity of the enclosures themselves is further enhanced by the use of composite material for the rear, top and bottom and side walls. This composite material preferably comprises an end-grained balsa core sandwiched between two exterior layers of fiberglass. Use of this material provides a high decibel output per pound weight of speaker enclosure.

While this modular system provides versatility in hanging the loudspeaker modules in either vertical or horizontal alignment, thereby providing one degree of directability for the sound emanating from the modules, a further degree of directability is provided by the ability to removably mount either one of two types of speaker horn modules at a desired angular orientation in one of the module types. The horn modules are sized to be received within half of the volume of this module type. When placed in the enclosure, a rearwardly projecting threaded arm extends through a port in the rear wall. A quick release hub is threaded onto the arm to mount the horn. Two types of interchangeable horns are provided. One of these types, the midrange/tweeter, is directionally polarized to enable selection of either vertical or horizontal orientation in the module. By varying the angle of disposition between the suspended enclosures and by orienting the horn speaker within the enclosure in a desired manner, maximum versatility is provided in adapting the vertical and horizontal polar response characteristics of the system to the acoustical characteristics of a particular venue.

Because of the exterior shape of the enclosures, the space required to transport a large number of such enclosures is reduced. The top and the bottom walls of the enclosures are trapezoidal in shape, converging from a dimension of 48 inches at the forward opening to a dimension of 33¼ inches at the rear wall. Thus, proper placement of the enclosures within a width of 90 inches is sufficient to contain two of the enclosures in a side by side, inverted relationship.

These and other features of the invention will be more clearly understood in view of the following detailed description and the drawings in which:

DETAILED DESCRIPTION OF THE DRAWINGS

Figure 1:
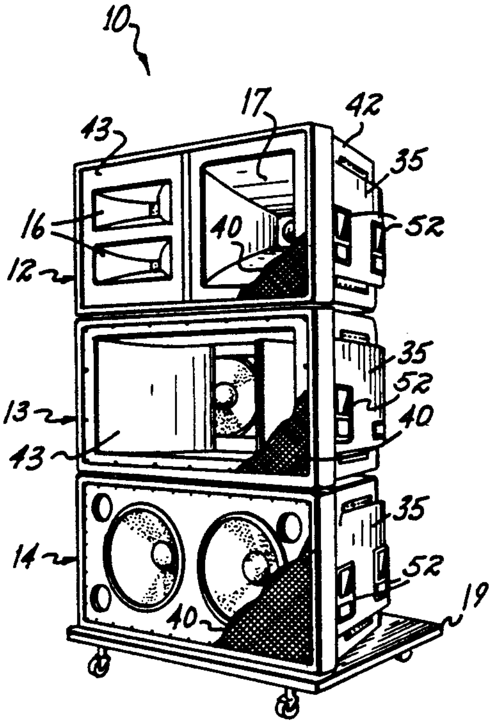
FIG. 1 is a perspective view of several vertically stacked loudspeaker modules that comprise a modular loudspeaker system in accordance with the invention.

FIG. 1 shows the three basic components which make up the modular speaker system 10 of this invention. The system 10 includes a first module type 12, a second module type 13 and a third module type 14. The module types are sized and shaped the same, but are distinguishable based upon the speaker components mounted therein, and the electrical connection on the rear walls of the modules. As shown in FIG. 1, the first module type 12 includes a removably mounted midrange/tweeter horn speaker 16 (M/T unit) and a similarly sized, removably mounted mid-bass horn speaker 17 (M/B unit).

The M/T unit 16 is comprised of a two barrel midrange horn with two 2" (5 cm) compression drivers and a two barrel tweeter horn with two 1" (2.5 cm) compression drivers. These horns are formed together into a single horn unit sized to be received within half of the enclosure 12 volume. The M/T unit 16 can be oriented such that the wider mouth dimension is aligned either vertically or horizontally to enable a technician to mount the units 16 in order to accommodate the vertical or horizontal polar response characteristics of the arena or performance location. The M/B unit 17 comprises a 10" (25 cm) midbass driver coupled to a horn. The M/T units 16 and the M/B units 17 are sized to be interchangeable so that any two of the modules can be mounted in one of the first module types 12, as shown in FIG. 2, where two M/T units 16 are mounted vertically in an upper module 12 and two M/B units 17 are mounted in the module 12 below.

The M/T unit 16 has a maximum usable band width of about 1 K to 17 KHz. The M/B unit 17 has a maximum usable band width of about 350–1500 Hz. The second module type 13 includes twin 15" (38 cm) drivers coupled to a horn fixedly mounted therein. This module type 13 has a maximum usable band width of about 75-500 Hz. The third module type 14 includes twin 18" (46 cm) drivers mounted in a vented enclosure. This module type 14 has a maximum usable band width of about 30-130 Hz.

Figure 2:
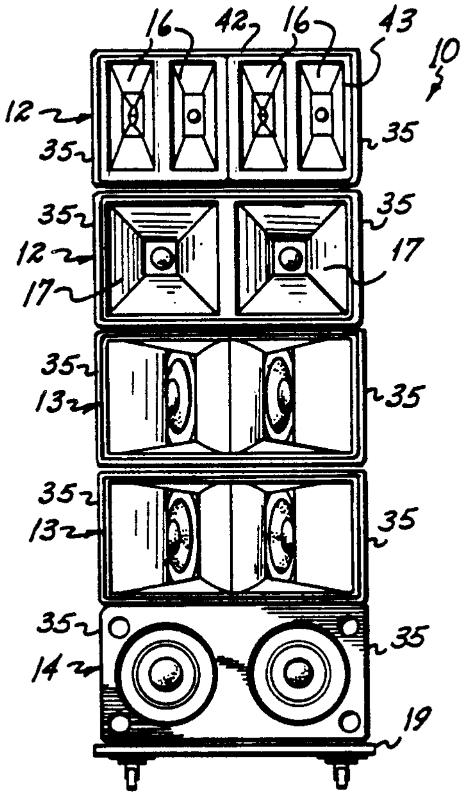
FIG. 2 is a front view similar to FIG. 1, but with the horn speaker units reoriented in both of the first module types.

As stated previously, all three types of modules are similar in size and shape in order to facilitate suspending or hanging of the system 10, and further to facilitate transportation and stacking, as shown in both FIGS. 1 and 2, where the modules are stacked on a roll cart 19. For additional stability in vertical stacking, each module top wall has indexors (not shown) sized to receive feet projecting from the bottom wall of a module stacked thereon.

Depending upon the acoustical characteristics of the performance venue, a system 10 may comprise any selected number of each of the three types of modules. The number of M/T units 16 and/or M/B units 17 will depend upon the required number of first module types 12, and the sound directability that is desired.

Figure 3:
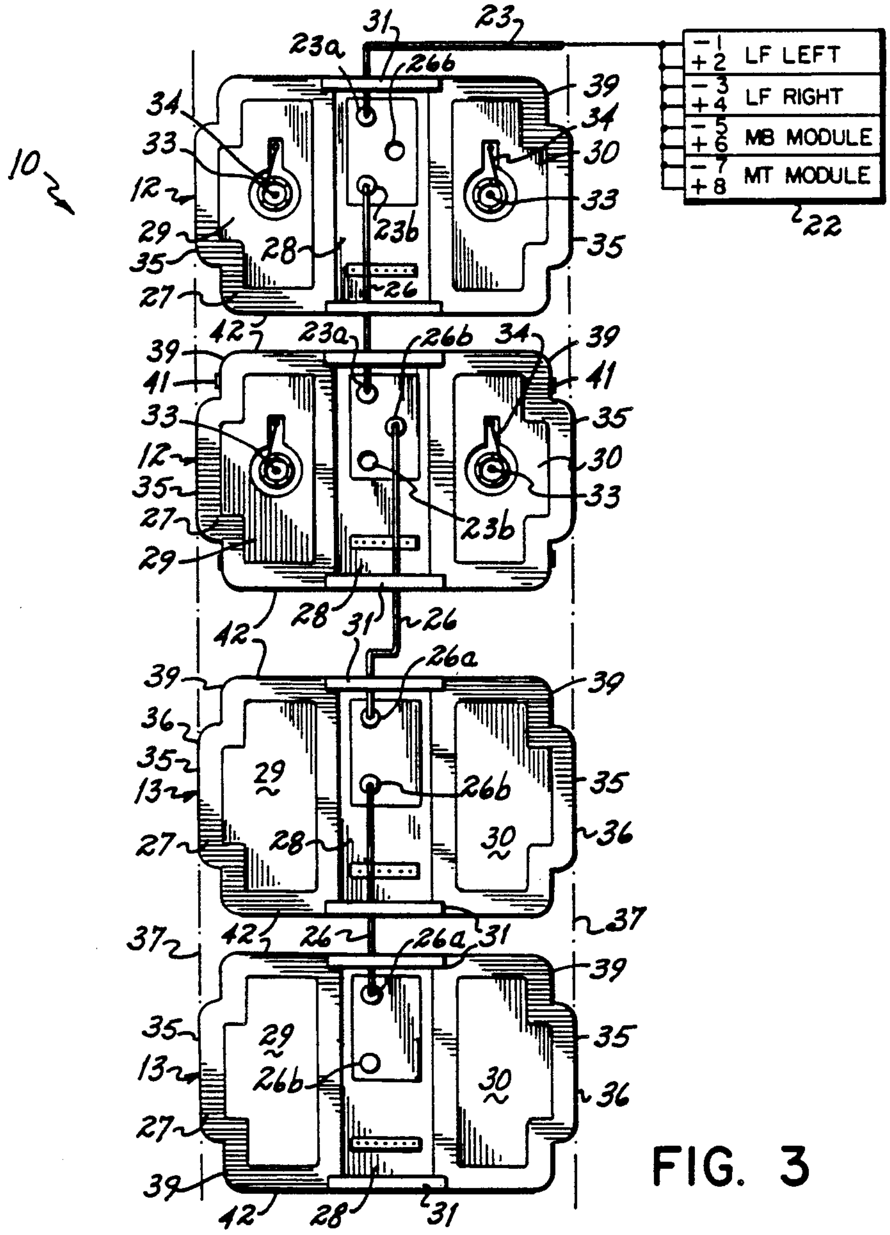
FIG. 3 is a rear view which schematically shows the cable connections between four modules in a modular loudspeaker system in accordance with the invention.

FIG. 3 schematically shows the electrical connections for one selected system 10 comprising two of the first module types 12, and two of the second module types 13. A signal source 22, i.e., the output of an amplifier, provides a signal that is to be input to a module type 12 in the system 10. Enclosure type 12 includes an input jack *23a* adapted to receive cable 23 and an output jack *23b* adapted to receive another cable 23 to output the signal to another module type 12. Cable type 23 carries electrical signals for each of the three different module types, and connection of a second module type 12 to an output jack *23b* will connect similar speaker components of the subsequent module 12 in parallel. Module type 12 also has an output jack *26b* adaptable for connectable receipt of one end of an electrical cable 26 that carries electrical output signals to the second module type, 13 via an input jack *26a*. Connection of additional second type modules with additional cables 26 via jacks *26a* and *26b* connects the speakers in the additional modules in parallel. Additional features of the electrical connection scheme of the system 10 will be discussed in more detail later in the detailed description.

Cable routing from module to module is simplified by the structural configuration of the rear wall 27 of each of the module types. The rear wall 27 includes a centrally located, recessed portion 28 located between two left and right removable panels 29 and 30. At the top and bottom edges of the rear wall 27, a cross bar 31 connects the left and right portions of rear wall 27. Cabling between adjacent speaker modules can be routed between the cross bar 31 and the recessed portion 28, thereby minimizing the chance of cable entanglement.

Figure 5:
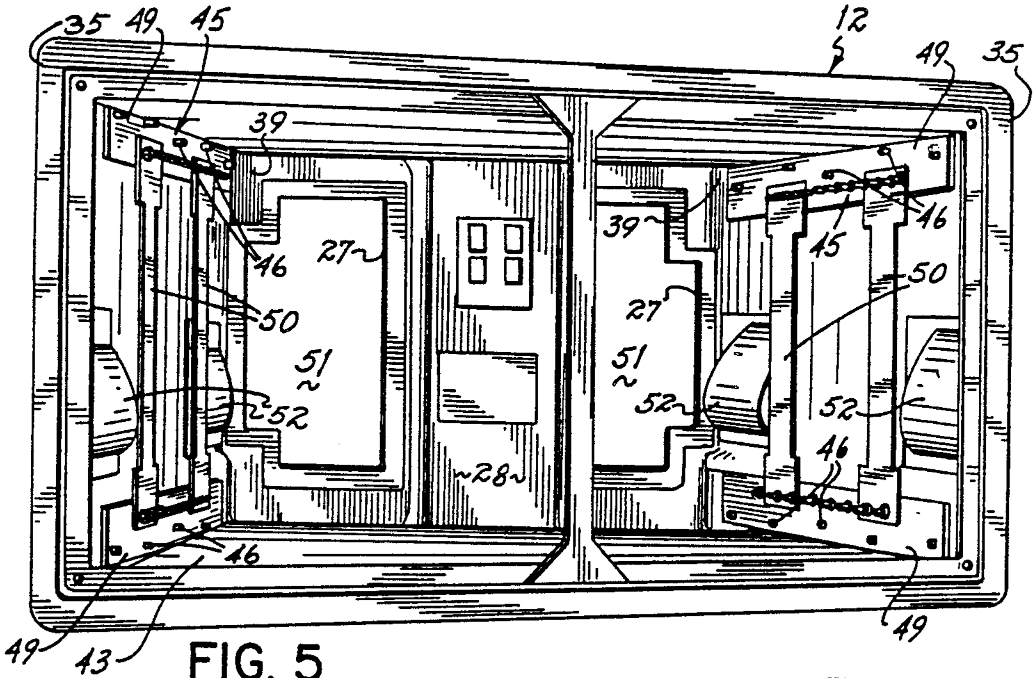
FIG. 5 is a front view of a loudspeaker module in accordance with the invention.

The rear wall 27, a pair of similarly shaped side walls 35 and a pair of similarly shaped top and bottom walls 42 define a forward opening 43 spaced forwardly from rear wall 27. FIG. 5 shows a view into this forward opening. A sound permeable front cover 40 (shown in FIG. 1) may be placed over the opening 43 to conceal the speakers mounted in the module.

Removable panels 29 and 30 of rear wall 27 each have a port (not shown) formed therein through which a rearwardly projecting exteriorly threaded arm (not shown) extends when either an M/T unit 16 or an M/B unit 17 is placed within the module 12. A quick release hub 33 is threaded onto the arm in order to mount the horn to the enclosure 12.

FIG. 3 also shows the positions of the side walls 35 of each of the enclosures when stacked or hung vertically. Each side wall 35 includes a major planar surface 36 which, when aligned in this manner with the other modules, resides in an external vertical plane 37. Each side wall 35 also includes upper and lower marginal edge portions 39 that are recessed inwardly from the respective vertical plane 37. At least one connector 41 is situated within each recessed marginal edge portion 39.

Figure 4:
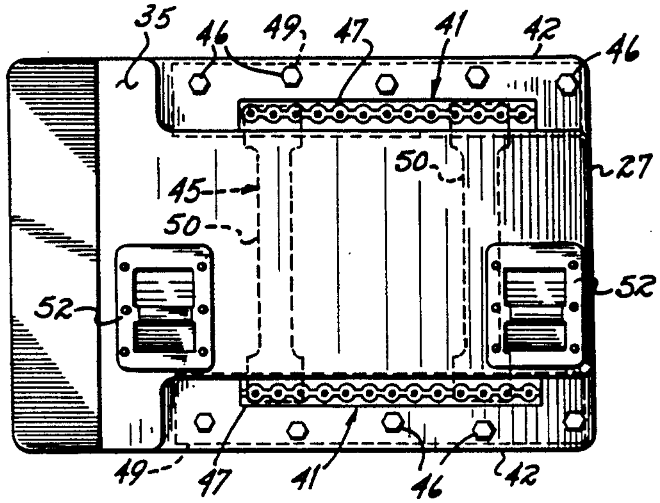
FIG. 4 is a side view of a loudspeaker module which shows the reinforced connectable means integral with each side wall in accordance with the invention.

FIG. 4 is a side view of one of the enclosures, showing in dotted lines the reinforced skeletal structure, or the reinforced connectable means 45, that is an integral part of each side wall of all of the module types. The reinforced connectable means 45 includes the connectors 41 located outside of the module. The connectors 41 include both a series of bolts 46 and an L-track 47 situated within each marginal edge portion 39, and, on the inside of the enclosure, a pair of parallel plates 49 mounted opposite the marginal edge portions and a pair of parallel braces 50 that interconnect the plates 49 (shown in FIG. 5 in more detail). Preferably, the plates 49 and braces 50 are of aluminum and have a thickness of about $\frac{1}{4}$". The connectors 41 secure the plates 49 to the side wall 35. When a selected number of modules are hung in vertical alignment, the hanging weight or stress of the entire system lo is distributed substantially uniformly along the two vertical planes 37 occupied by the aligned connectable means 45. As opposed to prior systems that required glued joints to bear the load of enclosures suspended below, the configuration of this loudspeaker system 10 improves overall structural integrity by placing the hanging weight substantially in an aligned, internally reinforced skeletal structure.

FIG. 5 shows the inside of a module 12 prior to mounting of the M/T units 16 and/or M/B units 17 therein. Each reinforced connectable means 45 is integral with a side wall 35, and extends entirely across each side, i.e., the distance between the top and bottom walls. This view also shows a void 51 formed in each outer portion of the rear wall 27 of module type 12. Covers (not shown) are secured to the rear wall 27 over each void 51 when in use, preferably by screws. Each cover must have a port formed therein sized to receive therethrough a rearwardly projecting threaded arm of a horn unit.

Figure 6:
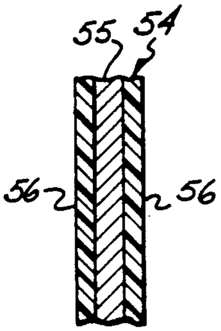
FIG. 6 is a cross-sectional view showing the composition of each of the walls that form the modules.

Handles 52 mounted to the side walls 35 facilitate transporting of the module 12. FIG. 6 shows a cross-sectional view of the composite material 54 which comprises the walls of each of the modules. The light weight composite material 54 lends to the structural integrity of the modules and also results in a high decibel per pound rating for the system 10. The composite material 54 comprises a middle layer of balsa core 55 sandwiched between two outer layers of fiberglass 56. Preferably, the external surfaces of the top, bottom and side walls of each module are painted black in order to reduce the visibility of the system 10.

Figure 7:
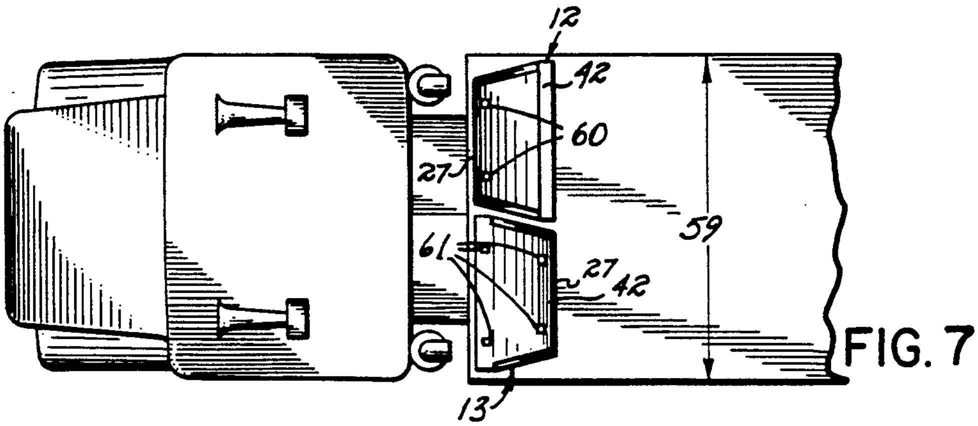
FIG. 7 shows a manner of loading two loudspeaker modules in accordance with the invention.

As mentioned previously, the top and bottom walls 42 are trapezoidal in shape, with a greater forward dimension than rearward dimension. Overall, for example, each module type is 25$\frac{1}{2}$" (64.8 cm) high, 30" (76.2 cm) deep, and 48" (121.9 cm) wide with a front tapering 16$\frac{1}{2}$° to 33$\frac{3}{8}$" (85 cm) wide at the rear. Thus, as shown in FIG. 7, proper disposition of the modules in inverted side-by-side relationship will require a truck with an inside dimension 59 of merely 90", as opposed to the previously required 96" internal dimension for two speaker enclosures with a 48" front span, and no tapering. FIG. 7 also shows the indexors 60 attached on each top surface of the modules and located near the rear wall 27. Four feet 61 protrude downwardly from the bottom surface of each module. In FIG. 7 the upper module rests upon its bottom surface, while the lower module rests upon its top surface. The indexors 60 and feet 61 provide additional stability when the modules are stacked vertically, either for transport or during a performance.

Figure 8:
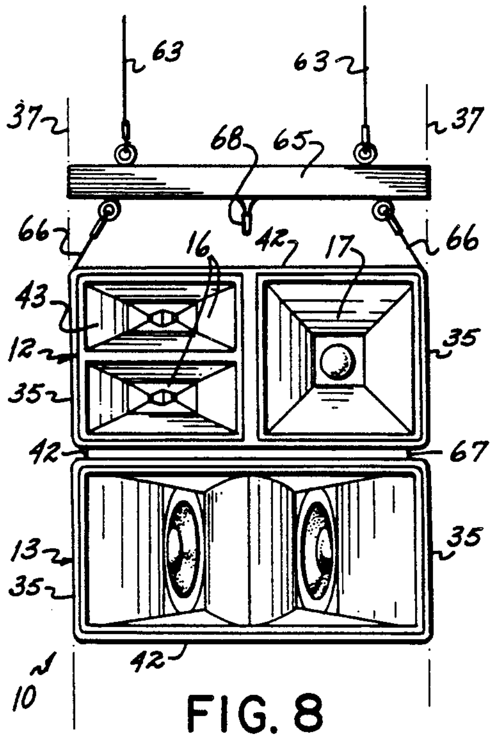
FIG. 8 shows a front view of a manner of hanging two loudspeaker modules in accordance with the invention.

FIG. 8 shows one manner of hanging the system 10. A pair of chains 63 are secured at their upper ends to a supporting structure such as a ceiling, and connected at their bottom ends to a horizontally oriented fly bar 65. The fly bar 65 includes hardware for attaching supporting straps in a variety of configurations. Another pair of straps 66 connect module 12 to the fly bar 65. The bottom ends of each of the straps 66 are attached to the L-tracks 47 residing within the upper marginal edge portions 39. A pair of rigid spacers 67 connect a module type 13 to a module type 12. These rigid spacers 67 are connected to bolts 46 residing within the lower marginal edge portion 39 and the upper marginal edge portion 39 of enclosures 12 and 13, respectively. As noted, the attached spacers 67 reside inboard of vertical planes 37.

Figure 9:
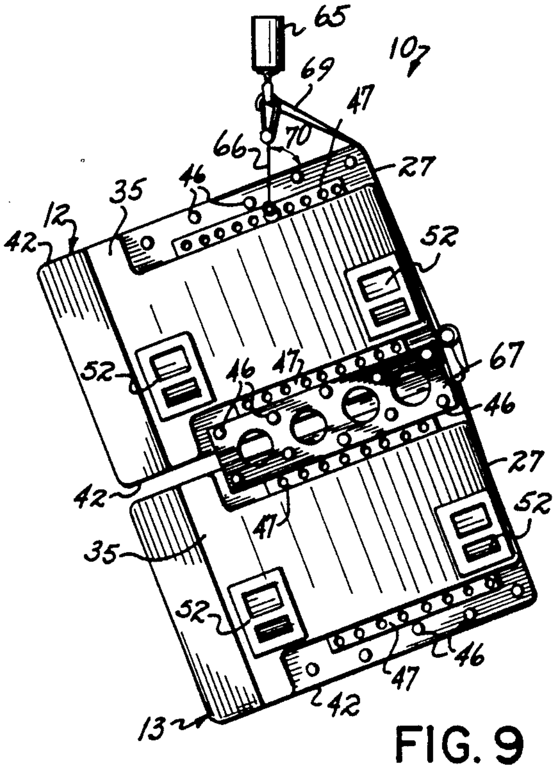
FIG. 9 shows a side view of another manner of hanging two loudspeaker modules in accordance with the invention.

FIG. 9 shows a side view of the same system 10 shown in FIG. 8, but with a tilt/splay strap 69 also connected to the fly bar 65 in order to hold the system 10 at a desired angle 70 of inclination with the vertical. The top of strap 69 is connected to bar 65 through eye bolt 68 (shown in FIG. 8) while the bottom is connected to an additional L-track mounted in the rear wall 27 of either of the hanging modules. It is noted that in both FIGS. 8 and 9 the angle of disposition between module 12 and module 13 is 0°.

Figure 10:
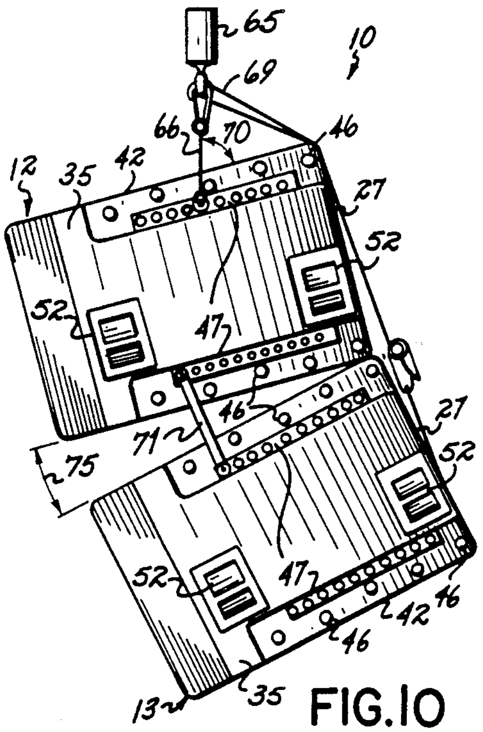
FIG. 10 shows a side view of yet another manner of hanging two loudspeaker modules in accordance with the invention.

FIG. 10 shows a side view of the same system 10 of FIGS. 8 and 9, but with rigid spacers 67 removed and a strap 71 connected in its place. Strap 71 is interconnected between the lower and upper L-tracks 47 of modules 12 and 13, respectively. Each end of a strap 71 includes a slidable member that is insertable at either end of the L-track 47 and laterally movable along the L-track 47 into any one of the detented positions, thereby enabling the angular disposition 75 between module 12 and module 13 to be varied.

Figure 11:
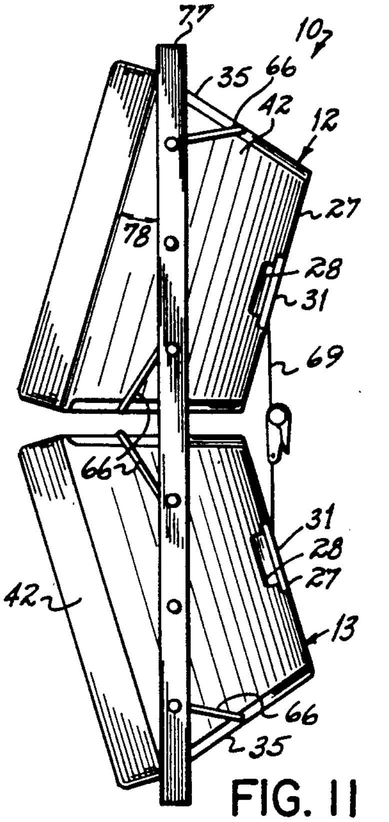
FIG. 11 shows a top view of a manner of hanging two loudspeaker modules side by side in accordance with the invention.

FIG. 11 shows a top view of a module 12 and a module 13 hung side by side. Fly bar 77, longer in length than fly bar 65, supports straps 66 which are connected at their bottom ends to the L-track 47 in respective upper marginal edge portions 39 of the modules 12 and 13. In this configuration, tilt strap 69 is connected horizontally between enclosure 12 and 13 to provide a desired angular disposition designated by angle 78. The longer length fly bar 77 can be formed by attaching two of the shorter fly bars 65 together.

Figure 12:
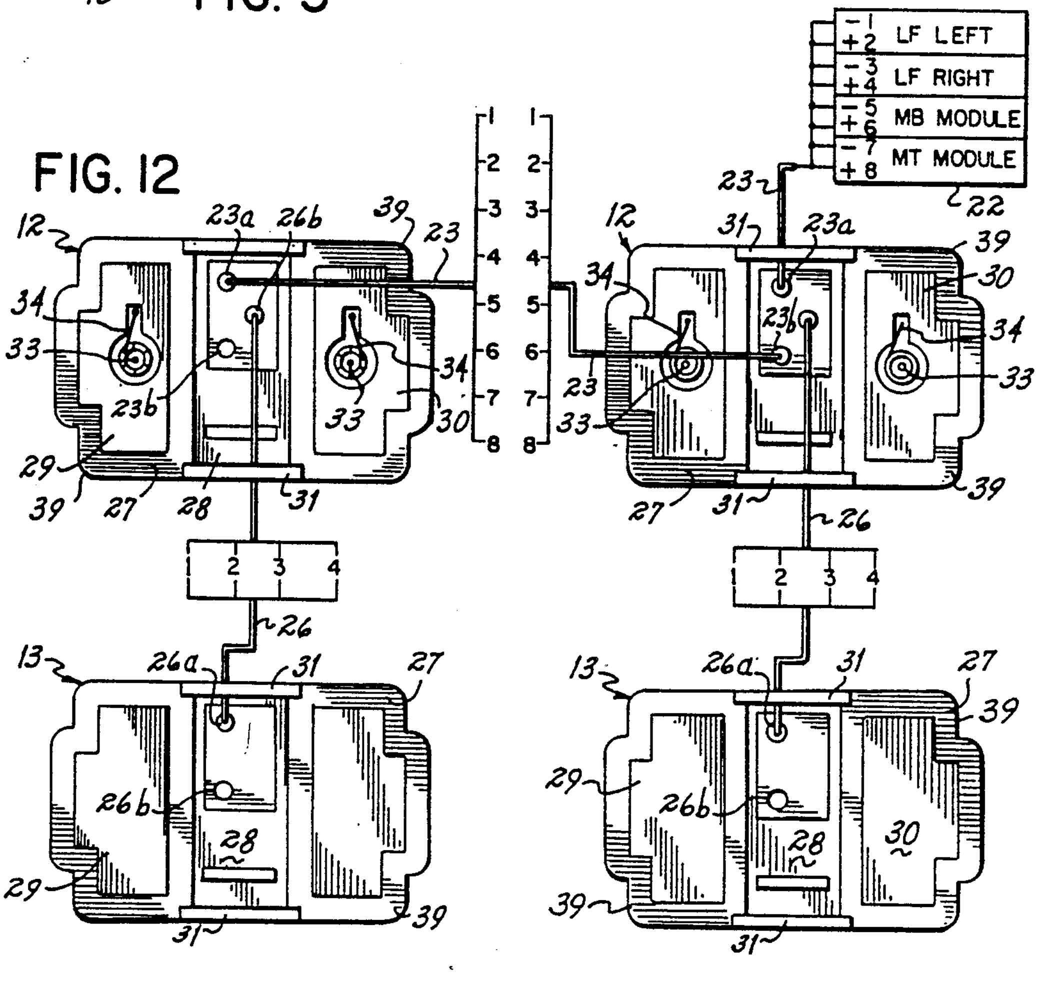
FIG. 12. shows schematically one form of electrically connecting a selected system comprising two first and two second module types in accordance with the invention.

Referring to FIG. 12, system 10 incorporates multipin cabling that allows flexibility and simplicity in connection. A jumper cable (preferably 5 ft. (1.524 m)) electrically connects the modules. Cable 23 is an 8 conductor cable, and cable 26 is a 4 conductor cable. Both terminate with a male Cannon connector (EP-8 or EP-4) at a first end and a female Cannon connector at the other end. The first end always connects to the signal source and the second end always connects to a load. The main input for any system 10 that includes one module 12 and one module 13 is an 8-pin, male connector (Cannon EP-8) input jack 23*a* located on the recessed portion 28 of rear wall 27 of the module 12. The pin designations are as follows:

| Pin # | Connection |
|---|---|
| 1− | right woofer of module 13 (as viewed from the front) |
| 2+ | |
| 3− | left woofer of module 13 (as viewed from the front) |
| 4+ | |
| 5− | M/B unit |
| 6+ | |
| 7− | M/T unit |
| 8+ | |

The above pin designations indicate that the woofers in module 13 have separate inputs. Thus, for the system shown in FIG. 12, every pair of wires terminates into a nominal 8 ohm load. This allows use of one module 13 (with separate woofer inputs) with nominal impedance of 8 ohms, or two parallel modules 13 resulting in an impedance of 4 ohms. Internally, pins 5 and 6 carry the electrical signal to the M/B unit 17 via an internal 3 pin connector on the rear side of the input panel (shown in FIG. 13). In the same manner, pins 7 and 8 are connected internally to the M/T unit 16.

Pins 1 thru 4 are internally connected to the 4-pin output jack 26*b* (female Cannon EP-4) located on a panel in the recessed portion 28 of rear wall 27 of module 12. A module 13 can now be connected with a cable 26. The module 13 input panel has a 4-pin male jack 26*b* (Cannon EP-4) as its primary input. In this "basic" system 10, only one input cable from the source 22 is required, but both the modules 12 and 13 are now connected, and each pair of wires terminates into a nominal 8 ohm load.

As shown in FIG. 12, the cabling system is designed to connect a complete system 10 by parallelling a second set of module 12 and module 13 without having to run another cable 23 from the source 22. All that is required is another 8-pin jumper cable 23 and another 4-pin jumper cable 26. The male end of the additional 8-pin, jumper cable 23 is connected to the 8-pin, female connector 23*b* on the first module 12 and the female end is connected into the 8-pin, male jack 23*a* on the second module 12. The additional 4-pin jumper cable 26 connects the second module 13 to the second module 12 using the same method that was used when wiring the first "stack".

The module 14 (subwoofer) requires a separate input cable 25 from the source 22. Its pin designations are as follows:

| Pin # | Connection |
|---|---|
| 1− | right woofer of module 14 (as viewed from the front) |
| 2+ | |
| 3− | left woofer of module 14 (as viewed from the front) |
| 4+ | |

Like the module 13, a 4-pin, female output jack 25*b* (Cannon EP-4) is the primary input for module 14. Each woofer has separate connections to again provide a nominal 8 ohm load on each pair of wires.

Figure 14:
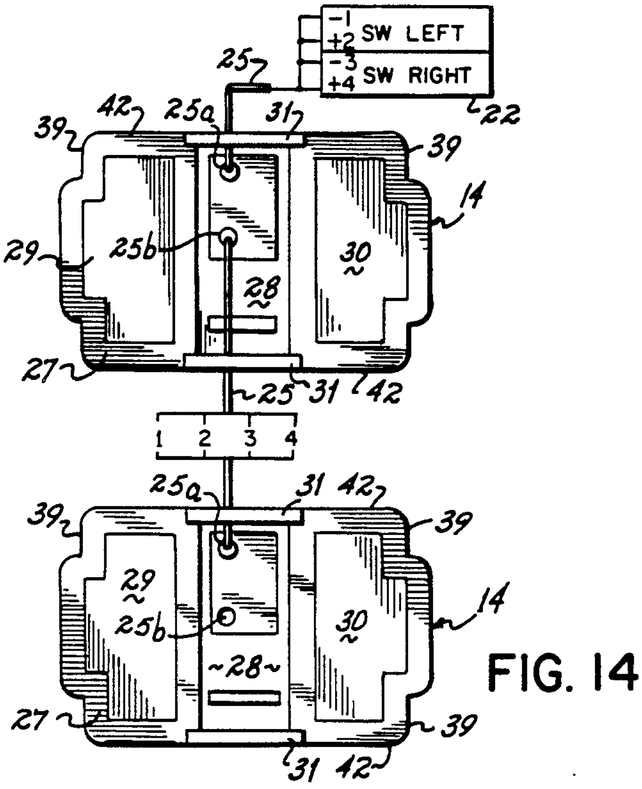
FIG. 14 shows schematically the electrical connections for a third module type.

A second module 14 can also be paralleled by using another 4-pin jumper cable 25. As shown in FIG. 14, this is accomplished by connecting the male end of the cable 25 to the 4-pin, female output 25*b* located the input panel of the first module 14, and connecting the other end to the input 25*a* of the other module type 14.

This method of cabling allows connection of two, 3-box systems (2 of each module type) in parallel using only two input cables (one cable 25 and one cable 23) from the source. In this arrangement, every pair of wires terminates into nominal 4 ohm loads.

This same process can be continued until impedance loads are at the desired level which maximizes amplifier and cabling efficiency. It also makes mis-wiring virtually impossible. The above recommended cabling is a general method of connecting a given number of stacks by paralleling systems. Other methods are possible but minimum recommended impedance levels for various amplifiers should always be considered when cabling the system.

Figure 13:
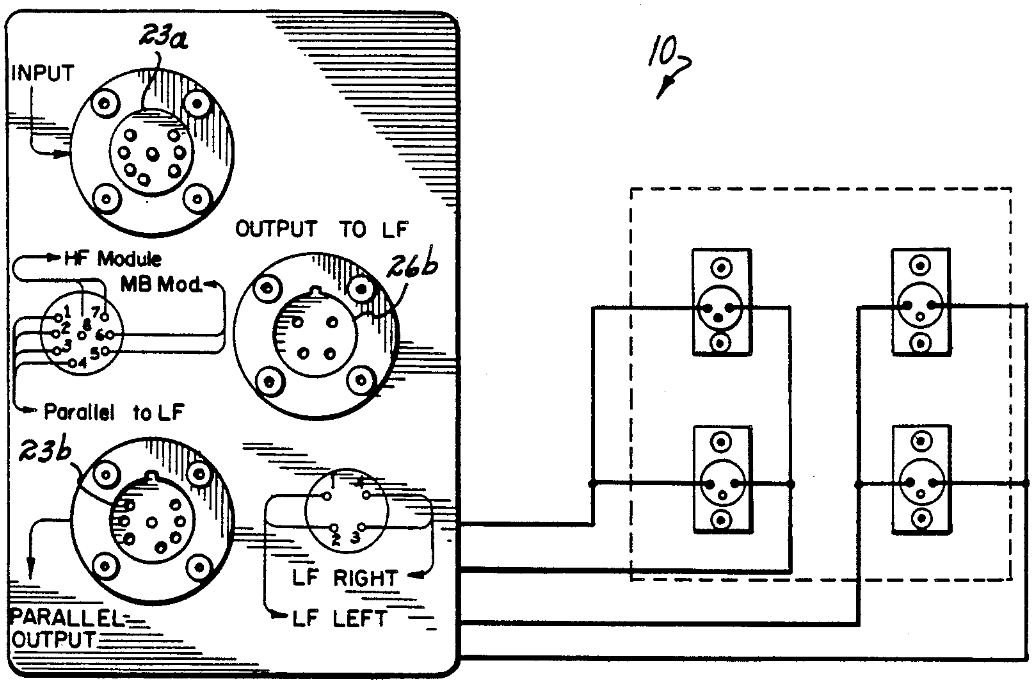
FIG. 13 shows a circuit schematic for the internal electrical connections in a first module type in accordance with the invention.

As mentioned above, one of the many features offered by the system 10 is the interchangeability of the M/T and M/B units 16 and 17 to tailor the polar response of the loudspeaker array. Accordingly, it sometimes may be required that a module 12 be loaded with two M/B units or two M/T units. Inside, at the back of the cabinet, two 3-pin connectors are provided for such a situation, as shown in FIG. 13. When installing two similar horn units in a module 12, simply connect the two like units into the appropriate connectors (i.e., 2 M/B units are connected to the two 3-pin connectors labeled M/B module).

There might be some situations where the jumper cables may not be of sufficient length to connect the modules in the configuration in FIG. 12. In this case, pins 1 thru 4 are not used. Instead, the input for the module types 13 is connected directly to the source 22, in parallel, using a 4-pin cable 26. This is similar to the way the modules 14 are connected in FIG. 14 and can be a viable solution when the modules 12 are not close enough to supply the electrical signal to the type 13 modules.

While a preferred embodiment of the modular speaker system 10 in accordance with the invention has been described, it is to be understood that various modifications and alterations of hanging and configuring a system are contemplated. For instance, the number and model of particular enclosures required, and the types of horn modules fitted and oriented therein can be adapted to meet the acoustical requirements of a wide variety of venues. Accordingly, it is to be understood that changes may be made without departing from the scope of the invention as particularly set out and claimed.

What is claimed is:

1. A loudspeaker module especially adapted for reinforced connection in a system having a plurality of modules, comprising:

a rear wall;

top and bottom walls and two side walls extending forwardly from said rear wall and forming with said rear wall an enclosure defining an opening spaced forwardly of said rear wall;

at least one speaker mounted to said enclosure within the opening; and a pair of reinforced connectable means for reinforcement of respective side walls of said loudspeaker module, each connectable means being an integral part of a respective one of said two side walls, each connectable means including at least one connector means for securement to another said module.

2. The loudspeaker module of claim 1 wherein each said reinforced connectable means further comprises:

two pairs of plates, each pair of plates being secured to a respective one of said two side walls inside the enclosure; and two pairs of spaced braces, each pair of spaced braces interconnecting a respective pair of plates.

3. The loudspeaker module of claim 2 having aluminum plates and braces.

4. The loudspeaker module of claim 2 wherein each of the connector means comprises a series of bolts securing each said plate to the respective side wall, and an L-track connector secured to said plate for connecting to another said module.

5. The loudspeaker module of claim 1 wherein each said side wall has an outwardly directed planar surface and upper and lower marginal edge portions recessed from said planar surface.

6. The loudspeaker module of claim 1 wherein said top and bottom walls and said side walls define a rectangular forward opening and said rear wall is smaller than said forward opening, said top and bottom walls have a trapezoidal shape, and said side walls converge from said forward opening toward said rear wall.

* * * * *